(12) United States Patent
Yano et al.

(10) Patent No.: US 6,252,238 B1
(45) Date of Patent: Jun. 26, 2001

(54) MICRO-PROCESSING METHOD USING A PROBE

(75) Inventors: Koji Yano, Zama; Ryo Kuroda, Kawasaki, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/149,277

(22) Filed: Sep. 9, 1998

(30) Foreign Application Priority Data

Sep. 11, 1997 (JP) .................................................... 9-264906

(51) Int. Cl.[7] .............................. A61N 5/00; G21G 5/00
(52) U.S. Cl. .................................. 250/497.1; 252/299.01
(58) Field of Search ........................... 369/126; 430/270, 430/19; 252/299.01; 346/153.1

(56) References Cited

U.S. PATENT DOCUMENTS

| | | | |
|---|---|---|---|
| 5,162,819 | * 11/1992 | Sakai et al. | 346/153.1 |
| 5,270,149 | * 12/1993 | Iselborn et al. | 430/270 |
| 5,343,460 | * 8/1994 | Miyazaki et al. | 369/126 |
| 5,389,475 | * 2/1995 | Yanagisawa et al. | 430/19 |
| 5,558,813 | * 9/1996 | Akashi et al. | 252/299.01 |

FOREIGN PATENT DOCUMENTS 63-161552 7/1988 (JP) .
63-161553 7/1988 (JP) .

OTHER PUBLICATIONS

G. Binning, et al., "Surface Studies by Scanning Tunneling Microscopy", Physical Review Letters, vol. 49, No. 1, Jul. 5, 1982, pp. 57–61.

* cited by examiner

Primary Examiner—Jack Berman
Assistant Examiner—Johnnie L Smith, II
(74) Attorney, Agent, or Firm—Fitzpatrick, Cella, Harper & Scinto

(57) ABSTRACT

An electroconductive micro-region surrounded by a non-electroconductive region is formed on a non-electroconductive substrate surface. Such an electroconductive micro-region is formed by forming a non-electroconductive thin film on a non-electroconductive substrate surface, then approximating a probe having a micro-aperture of light to the spot to be processed of the non-electroconductive thin film, and irradiating the non-electroconductive thin film with light through the micro-aperture of the probe to thereby increasing the electroconductivity of the non-electroconductive thin film at the spot. The electroconductive micro-region can be formed so that it confines electrons to exhibit quantum effects.

3 Claims, 3 Drawing Sheets

MICRO-PROCESSING METHOD USING A PROBE

BACKGROUND OF THE INVENTION

1. Field of the Invention

This invention relates to a micro-processing method for forming an extremely small electroconductive region surrounded by a non-electroconductive region on a non-electroconductive substrate and, more particularly, it relates to a micro-processing method using a scanning probe microscope provided with a probe having a micro-aperture for irradiation of light.

2. Related Background Art

The invention of the scanning tunneling microscope (hereinafter referred to as STM) made it possible to observe the surface of the specimen with an enhanced degree of resolution such that the observer can visually perceive atoms [G. Binnig et al., Phys. Rev. Lett. 49, 57(1982)]. In other words, a real space image of the specimen can be obtained at the atomic or molecular level. A scanning tunneling microscope is designed to scan the surface of an electroconductive specimen by controlling the distance between the probe electrode of the microscope and the specimen in such a way that the tunneling current may be held to a constant level. Then, information on the electron cloud of the surface of the specimen and the profile of the specimen can be obtained from the control signal used for controlling the operation. Such information normally contains data on details of the specimen expressed in terms of sub-nanometer.

The atomic force microscope (hereinafter referred to as AFM) is also a recent invention that can be used to observe the surface of the specimen with an enhanced degree of resolution. The AFM can be used to observe details of the surface of a non-electroconductive object in terms of sub-nanometer.

Microscopes such as STMs and AFMs that are designed to two-dimensionally scan the surface of the specimen by means of a probe in order to obtain physical information on the surface of the specimen on the basis of the interaction of the probe and the surface of the specimen are generally referred to as scanning probe microscopes (SPM). The SPM is attracting attention as means for observing the surface of an object with an enhanced degree of resolution.

It is now possible to carry out a micro-processing operation on a material at the atomic level of atoms by applying the principle underlying the SPM.

Japanese Patent Application Laid-Open Nos. 63-161552 and 63-161553 describe a technology for raising the electroconductivity of an insulation film by applying a voltage to the film, utilizing the STM technology.

With the disclosed technology, an extremely small region of the order of nanometers having an enhanced electroconductivity can be produced in a film.

Generally, it is possible to prepare a device component showing a quantum effect by confining electrons within a micro-region of the order of sub-microns.

For example, a structure called a quantum dot that shows an electron confinement effect can be obtained by forming a spherical or cubic electroconductive region of the order of several nanometers to tens of several nanometers and enclosing it with a non-electroconductive region.

Similarly, a structure called a quantum wire can be obtained by forming a rod-shaped electroconductive region having a diameter of the order of several nanometers to tens of several nanometers and enclosing it with a non-electroconductive region. Thus, the technique of forming a structure adapted to confine electrons within an extremely small region plays a very important role in the process of preparing a device having a quantum effect.

However, with the technology disclosed by Japanese Patent Application Laid-Open Nos. 63-161552 and 63-161553, electrons cannot successfully be confined within an extremely small region because the region showing an enhanced electroconductivity is electrically connected to the substrate electrode.

SUMMARY OF THE INVENTION

In view of the above identified problem, it is therefore an object of the present invention to provide a micro-processing method adapted to form an extremely small electroconductive region surrounded by a non-electroconductive region on a non-electroconductive substrate without any electric connection.

According to the invention, the above object is achieved by providing a micro-processing method for forming an extremely small electroconductive region surrounded by a non-electroconductive region on a non-electroconductive substrate, characterized in that:

the extremely small electroconductive region is formed by irradiating a non-electroconductive thin film of a material apt to raise its conductivity by irradiation of light and arranged on said non-electroconductive substrate through a micro-aperture of a probe adapted for irradiation of light, thereby raising the conductivity of the non-electroconductive thin film.

DESCRIPTION OF THE PREFERRED EMBODIMENTS

Figure 1A:
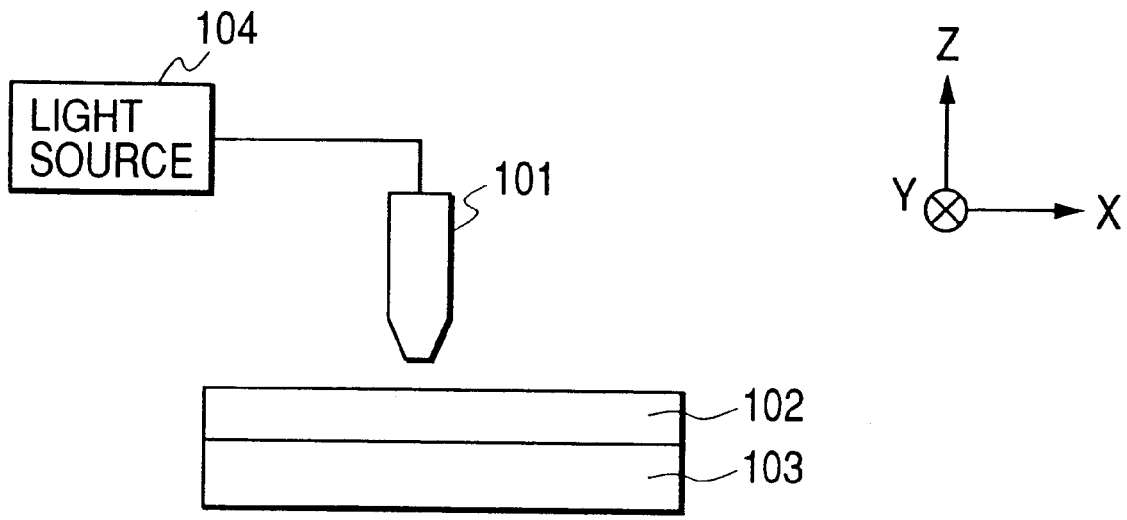
FIGS. 1A and 1B schematically illustrate the micro-processing method according to the invention.

As described above, according to the invention, an extremely small electroconductive region is formed by irradiating a non-electroconductive thin film which is made of a material that is likely to increase its conductivity by irradiation with light and arranged on a non-electroconductive substrate, through an optical micro-aperture of a probe disposed vis-a-vis the non-electroconductive thin film and adapted for light irradiation, thereby raising the conductivity of the non-electroconductive thin film. For the purpose of the invention, any material that is initially non-electroconductive but increases its electroconductivity when irradiated with light may be used for the non-electroconductive thin film.

Additionally, for the purpose of the invention, the mechanism of increasing the electroconductivity is not a problem so long as the conductivity is increased only when irradiated with light. For example, the state of electrons may be changed to increase the conductivity when irradiated with light or by the heat that is generated when irradiated with light. Materials that can show such a change include as $GeSb_2Te_4$, because its phase is photo-changeable.

For the purpose of the invention, the increase in the electroconductivity of a material refers to the generation of an energy level for electrons or holes that contributes to the electroconductivity of the material.

When, on the other hand, there already exists an energy level of electrons or holes that contributes to the electroconductivity of the material, it refers to the generation of a lower level.

In either case, the region where the electroconductivity is not increased operates as an energy barrier for the newly generated energy level.

For the purpose of the invention, the non-electroconductive substrate operates as an underlayer of the non-electroconductive thin film and is preferably very flat. For the purpose of the invention, the non-electroconductive thin film may be made of a material having an energy structure where a new energy level is generated by irradiation with light and an energy barrier exists for the newly generated energy level. Materials that can be used for the non-electroconductive thin film include not only electrically insulating materials but also semiconductors.

The probe has a micro-aperture at its tip, through which light is shed. Generally, a fiber having a pointed tip produced by etching is used for the probe. The size of the produced electroconductive region is determined by the size of the micro-aperture. The smaller the micro-aperture, the smaller the size of the electroconductive region.

When the micro-aperture is smaller than the wavelength of light used for forming an electroconductive region, evanescent light is produced from the micro-aperture at the tip of the probe. The intensity of evanescent light decreases exponentially as a function of the distance from the micro-aperture. Thus, a narrow area can be convergently irradiated with light to encourage a micro-processing operation.

Now, a micro-processing operation will be described by referring to FIGS. 1A and 1B.

Figure 1B:
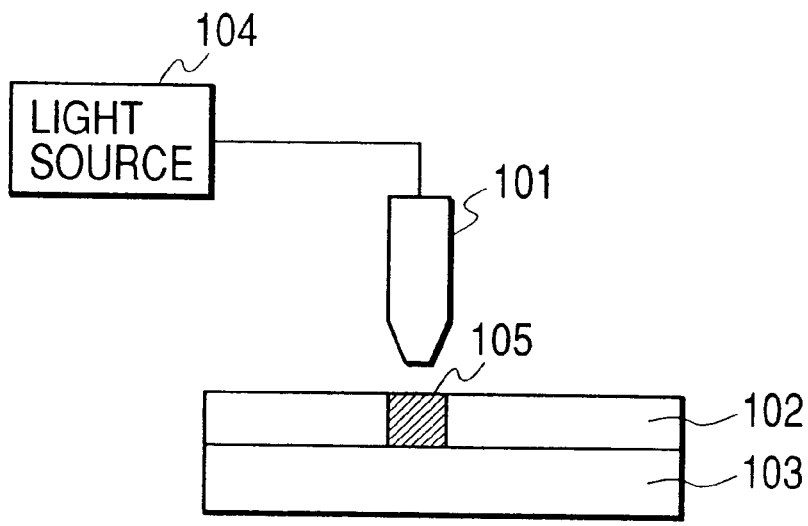

First, the tip of the probe 101 is placed on or near the surface of the non-electroconductive thin film 102 formed on a non-electroconductive substrate 103 at the spot to be processed (FIG. 1A). A position near the surface refers to the position where the probe is arranged to effectively irradiate the spot on the non-electroconductive thin film to be processed. In other words, the non-electroconductive thin film is irradiated with light at that spot with an intensity sufficient to increase the electroconductivity of the spot of the non-electroconductive thin film when the probe is located at that position.

Then, light is led to the probe 101 from a light source 104 and the non-electroconductive thin film 102 is irradiated with light coming through the micro-aperture at the tip of the probe 101. The electroconductivity of the non-electroconductive thin film is increased at the spot of irradiation (FIG. 1B).

This spot is hereinafter to as a conductivity-enhanced region 105. An energy barrier surrounds the conductivity-enhanced region to segregate it from the remaining portion of the non-electroconductive thin film where the electroconductive is not increased so that electrons or holes are confined to the conductivity-enhanced region.

For the purpose of the invention, the entire surface of the non-electroconductive substrate does not have to be non-electroconductive. More specifically, only a certain area located under a part of the conductivity-enhanced region expected to exert a quantum effect is required to be electrically non-conductive.

According to the invention, evanescent light is produced from the micro-aperture of the tip of the probe when the micro-aperture is smaller than the wavelength of light used for forming an electroconductive region. The intensity of the evanescent light decreases exponentially as a function of the distance from the micro-aperture.

Then, the surface of the non-electroconductive thin film is scanned by evanescent light and the evanescent light reflected by the specimen is detected to control the distance between the tip of the probe and the surface of the non-electroconductive thin film such that the intensity of the detected light remains constant. Thus, information on the surface of the non-electroconductive thin film including data on the undulations, if any, of the surface can be obtained from the signal used to control the distance.

Generally, such information can be obtained by a normal operation of a near-field optical microscope. Thus, the surface of a non-electroconductive thin film can be observed by means of such an operation of a near-field optical microscope before the thin film is processed so that the thin film can be placed in position and processed accurately and easily.

Note that the intensity of light used for observing the surface of the non-electroconductive thin film should be such that the electroconductivity of the thin film may not be increased.

Now, the invention will be described by way of examples.

EXAMPLE 1

Figure 2:
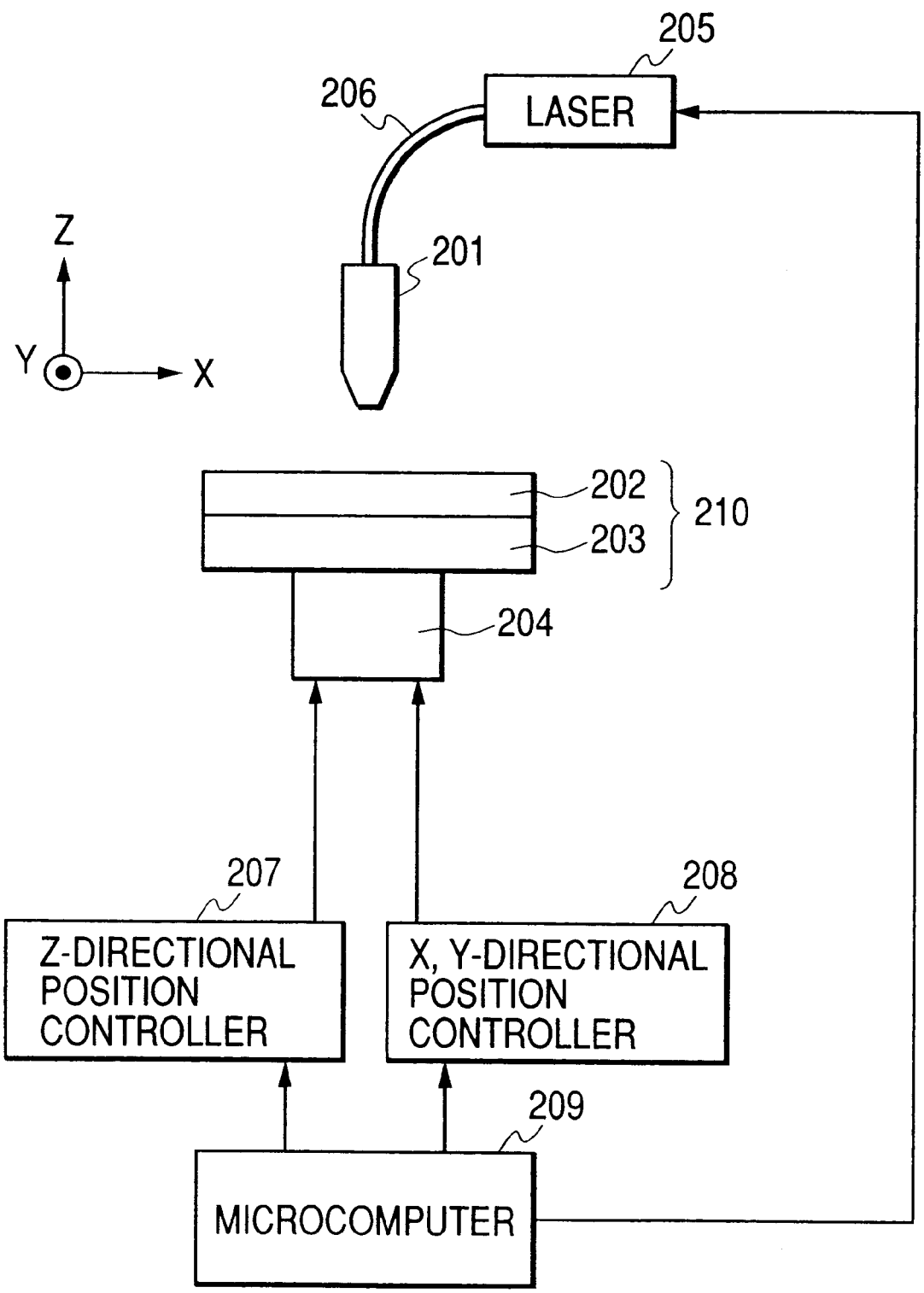
FIG. 2 is a schematic block diagram of a micro-processing apparatus used in Example 1.

In this example, a micro-processing method according to the invention is used in combination with a micro-processing apparatus as shown in FIG. 2. The micro-processing apparatus comprises:

probe 201, piezoelectric device 204, laser device 205, optical fiber 206,

Z-directional position controller 207,

XY-directional position controller 208 and microcomputer 209.

On the other hand, the specimen 210 to be processed comprises:

$GeSb_2Te_4$ thin film (non-electroconductive thin film) 202 and

Si substrate 203.

The Si substrate 203 is oxidized along the interface with the $GeSb_2Te_4$ thin film 202 to produce a 200 nm thick oxidized film and is hence, insulated. The $GeSb_2Te_4$ thin film 202 is an amorphous film formed by sputtering and has a film thickness of about 30 nm. The $GeSb_2Te_4$ thin film increase its electroconductivity when irradiated with light. The probe 201 is a probe normally used for a near-field optical microscope and prepared by sharpening the tip of an optical fiber 206 by operation etching operation. It has an opening with a diameter of 50 nm at the tip. The optical fiber 206 is connected to the laser device 205. The laser device 205 is a semiconductor laser and the laser beam emitted from the device is led to the opening of the probe 201 by way of the optical fiber 206.

The piezoelectric device 204 is a device normally used for an SPM and supports the specimen 210 on its top. The specimen 210 can be driven in each of the X-, Y- and Z-directions by externally applying a voltage to the piezoelectric device 204 so that the relative position of the probe 201 and the specimen 210 to be processed can be controlled.

The Z-directional position controller 207 controls the Z-directional position of the piezoelectric device 204 by applying a voltage to the piezoelectric device 204 according to the command from the microcomputer. The XY-directional position controller 208 controls the XY-dirctional position of the piezoelectric device 204 by applying a voltage to the piezoelectric device 204 according to the command from the microcomputer. The microcomputer 209 controls the overall operation of micro-processing the specimen 210 to be processed.

In this example, the micro-processing operation is conducted in a manner as described below.

First, the XY-directional position controller 208 issues a signal according to the command from the microcomputer 209 in order to drive the piezoelectric device 204 in the X-Y directions and move the tip of the probe 201 to the spot where the specimen 210 is to be processed on the surface.

Then, the Z-directional position controller 207 issues a signal according to the command from the microcomputer 209 in order to drive the piezoelectric device 204 in the Z-direction and move the tip of the probe 201 to the spot where the specimen 210 is processed on the surface.

In this example, a conductivity-enhanced region is formed on the $GeSb_2Te_4$ thin film 202 with a diameter of about 100 nm by irradiating the $GeSb_2Te_4$ thin film with a laser beam generated by the laser device 205 and fed through the optical fiber 206 and the micro-aperture at the tip of the probe.

The conductivity-enhanced region produced in this example is surrounded by the region of the thin film whose electroconductivity is not enhanced, the silicon oxide film and the atmosphere so that it can show an electron confinement effect.

EXAMPLE 2

Figure 3:
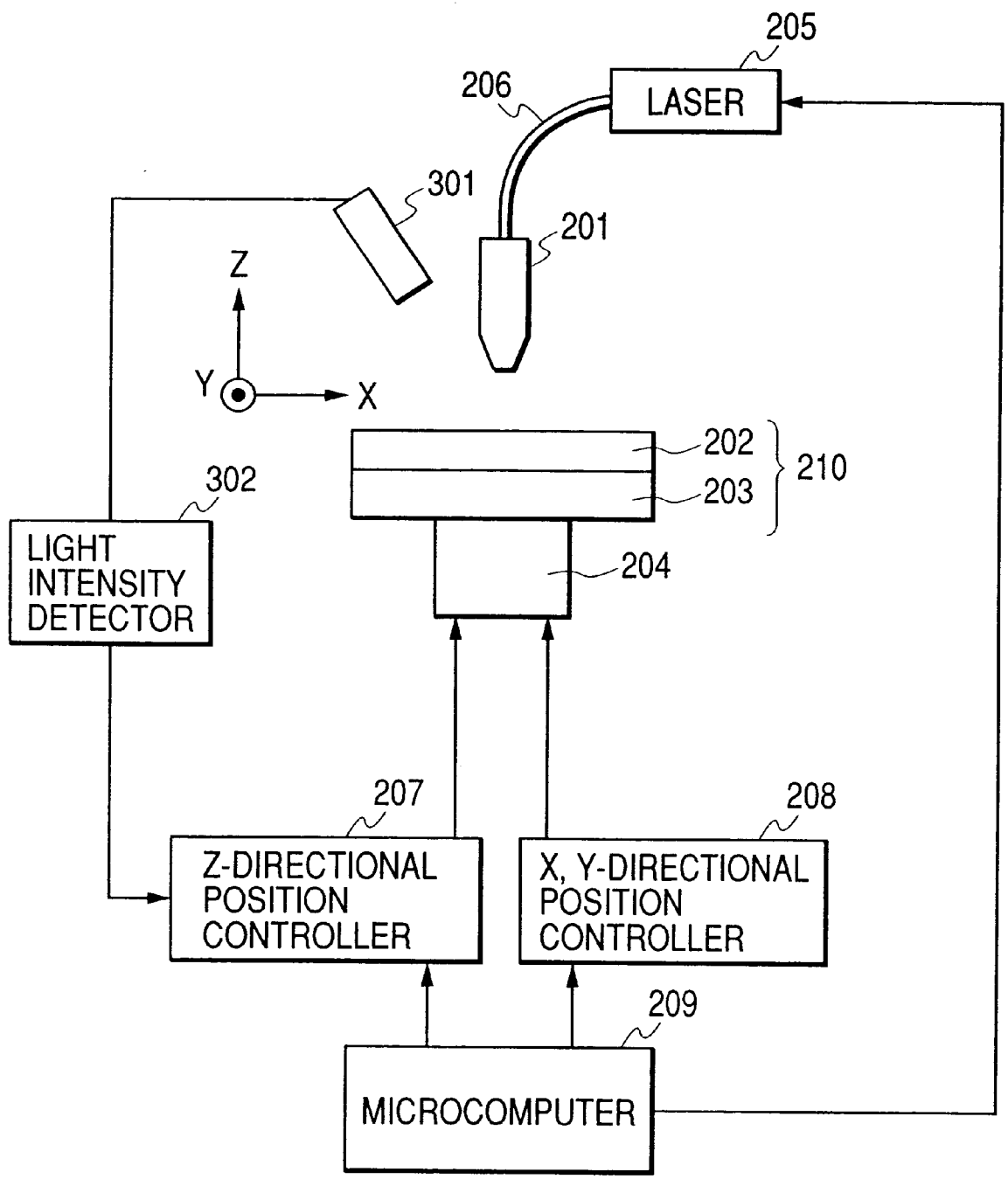
FIG. 3 is a schematic block diagram of a micro-processing apparatus used in Example 2.

In this example, a micro-processing method according to the invention is used in combination with a micro-processing apparatus as shown in FIG. 3. The micro-processing apparatus, comprises, in addition to the components of the micro-processing apparatus of FIG. 2, comprises:

a photomultiplier tube 301 and a light intensity detector 302.

The photomultiplier tube 301 is an ordinary photomultiplier tube that detects evanescent light emitted from the micro-aperture at the tip of the probe 201 and scattered at the surface of the $GeSb_2Te_4$ thin film by reflection. The light intensity detector 302 determines the intensity of light on the basis of the signal from the photomultiplier tube 301. The determined intensity of light is fed back to the Z-directional position controller 207. In this example, the Z-directional position controller 207 is also designed to operate as a servo circuit for controlling the irradiating operation to make the output value of the light intensity detector equal to the value contained in the command signal from the microcomputer.

The microcomputer 209 specifies the distance between the tip of the probe 201 and the specimen 210 by means of the output of the light intensity detector because the evanescent light seeping out from the micro-aperture at the tip of the probe 201 shows the intensity of light scattered at the surface of the specimen 210. Since the intensity of evanescent light decreases exponentially as a function of the distance from the micro-aperture, the intensity of scattered light exponentially decreases as a function of the distance between the tip of the probe 201 and the surface of the specimen 210 be processed.

In this example, the micro-processing operation is conducted in a manner as described below.

First, the distance between the tip of the probe 201 and the specimen 210 is specified as the detection output of the light intensity detector 302. Then, the Z-directional position controller 207 operates according to the command from the microcomputer 209 in order to bring the probe 201 closer to the specimen 210 until the output of the light intensity detector 302 gets to the specified value. Under this condition, the output of the laser device 205 is held to a level that does not increase the electroconductivity of the $GeSb_2Te_4$ thin film 202.

Then, the XY-directional position controller 208 issues a signal according to the command of the microcomputer 209, while maintaining the feedback control, in order to drive the piezoelectric device 204 in the X-Y directions and make the tip of the probe 201 scan the surface of the specimen 210. The surface profile of the specimen 210 can be observed on the basis of the XY-directional control signal and the Z-directional control signal as in the case of an ordinary near-field optical microscope. As a result of this scanning operation for observing the surface of the specimen, the spot to be micro-processed can be identified with ease on the surface of the specimen.

When the specimen gets to the right position for the micro-processing operation, the output voltage of the Z-directional position controller 207 and that of the XY-directional position controller 208 to the piezoelectric device 204 is locked to stop the movement of the specimen in the X-Y directions. Then, the laser device 205 is driven to operate by the command from the microcomputer 209 in order to irradiate the surface of the specimen and increase the electroconductivity of the $GeSb_2Te_4$ thin film.

In this example, a conductivity-enhanced region is formed at the right position on the $GeSb_2Te_4$ thin film 202 with a diameter of about 80 nm.

The conductivity-enhanced region produced in this example is also surrounded by the region of the thin film whose electroconductivity is not enhanced, the silicon oxide film and the atmosphere so that it can show an electron confinement effect.

What is claimed is:

1. A micro-processing method for forming an electroconductive micro-region surrounded by a non-electroconductive region on a non-electroconductive substrate, comprising the steps of:

moving a probe having a micro-aperture for irradiation of light to a spot to be processed on said substrate, said micro-aperture having a size smaller than a wavelength of light to be used for irradiation, wherein said light is evanescent light;

irradiating a non-electroconductive thin film formed on said non-electroconductive substrate with light through the micro-aperture of the probe; and forming an electroconductive micro-region confining electrons therein by altering the electroconductivity of said non-electroconductive thin film.

2. A micro-processing method according to claim 1, wherein said non-electroconductive thin film is made of a material whose phase is photo-changeable.

3. A micro-processing method according to claim 1, wherein a distance between a tip of said probe and said non-electroconductive thin film is held to a constant value during the processing operation by a light intensity detector for detecting evanescent light scattered at a surface of said thin film and a means for controlling the distance based on an output of said light intensity detector.

\* \* \* \* \*

UNITED STATES PATENT AND TRADEMARK OFFICE
CERTIFICATE OF CORRECTION

PATENT NO.    : 6,252,238 B1                                    Page 1 of 1
DATED         : June 26, 2001
INVENTOR(S)   : Koji Yano et al.

It is certified that error appears in the above-identified patent and that said Letters Patent is hereby corrected as shown below:

Column 1,
Line 46, "of atoms" should be deleted.

Column 2,
Line 61, "as" should be deleted.

Column 3,
Line 55, "ductive" should read -- ductivity --.

Column 4,
Line 50, "increase" should read -- increases --; and
Line 53, "operation" (both occurrences) should be deleted.

Column 5,
Line 35, "comprises," should be deleted; and
Line 62, "be" should read -- to be --.

Signed and Sealed this

Twenty-sixth Day of February, 2002

Attest:

Attesting Officer

JAMES E. ROGAN
Director of the United States Patent and Trademark Office